US005478781A

United States Patent [19]
Bertin et al.

[11] Patent Number: 5,478,781
[45] Date of Patent: Dec. 26, 1995

[54] POLYIMIDE-INSULATED CUBE PACKAGE OF STACKED SEMICONDUCTOR DEVICE CHIPS

[75] Inventors: Claude L. Bertin; Paul A. Farrar, Sr.; Wayne J. Howell, all of South Burlington; Christopher P. Miller, Underhill, all of Vt.; David J. Perlman, Wappingers Falls, N.Y.

[73] Assignee: International Business Machines Corporation, Armonk, N.Y.

[21] Appl. No.: 329,954

[22] Filed: Oct. 27, 1994

Related U.S. Application Data

[62] Division of Ser. No. 80,453, Jun. 21, 1993, abandoned.

[51] Int. Cl.[6] ............................................. H01L 21/60
[52] U.S. Cl. .................. 437/209; 437/211; 437/214; 437/217; 437/219
[58] Field of Search ............................. 437/209, 210, 437/211, 212, 213, 214, 215, 216, 217, 218, 219, 220

[56] References Cited

U.S. PATENT DOCUMENTS

| | | | |
|---|---|---|---|
| 4,525,921 | 7/1985 | Carson et al. | 29/577 |
| 4,672,737 | 6/1987 | Carson et al. | 437/209 |
| 5,075,253 | 12/1991 | Sliwa, Jr. | 437/211 |
| 5,104,820 | 4/1992 | Go et al. | 437/51 |
| 5,107,586 | 4/1992 | Eicherlberger et al. | 437/211 |
| 5,279,029 | 1/1994 | Burns | 437/209 |
| 5,380,681 | 1/1995 | Hsu | 437/209 |

OTHER PUBLICATIONS

WO-A-93 00703 (Irvine) Claims 1,8.
The GEC Journal of Research, vol. 7, No. 1, 1989, GB, pp. 16–27, A. D. Trigg 'design and fabrication of silicon hybrid multi-chip modules'FIG. 10.
Microelectronic Engineering, vol. 15, No. 1/4, Oct. 1991, NL, pp. 167–174, Moriya et al. 'results of the three–dimensional integrated circuits project in Japan', FIGS. 1, 2.

Primary Examiner—Brian E. Hearn
Assistant Examiner—Kevin M. Picardat
Attorney, Agent, or Firm—James M. Leas

[57] ABSTRACT

A cube package of stacked silicon semiconductor chips. To accommodate cube packaging, a metal transfer layer is added over the passivated chip face to bring all of the surface electrical contacts to a common chip edge. The metal transfer layer is insulated from the chip face and from the adjacent chip in the stack by polymer layers having a low dielectric constant, and a thermal expansion coefficient matching that of the stacked chips. An adhesive polymer layer is added to strengthen the bond between the first polymer layers and the adjacent chip in the stack, by deposition of the adhesive layer and partial cure at the wafer level, and then full cure when the chips are stacked together to form the cube.

36 Claims, 4 Drawing Sheets

POLYIMIDE-INSULATED CUBE PACKAGE OF STACKED SEMICONDUCTOR DEVICE CHIPS

This is a divisional of application Ser. No. 08/080,453 filed on Jun. 21, 1993, now abandoned.

BACKGROUND OF THE INVENTION

The invention generally relates to the cube packaging of a stack of semiconductor device chips and more particularly, to such packaging using insulating and adhesive materials permitting faster device operation, greater package reliability and enhanced package compatibility with existing semiconductor device processing techniques.

As is well known, the so-called "cube" package is a number of passivated device chips glued together in a stacked configuration. Each chip may have an "off-the-shelf" design layout including surface contact metallization. To accommodate "cube" packaging, each such device chip additionally is provided with a metal transfer layer over the passivated chip face to bring all of the surface electrical contacts to a common chip edge. Precise alignment of the chips, during the stacking and gluing assembly, allows for the bussing of all the common input-output lines on one or more faces of the resulting cube structure.

U.S. Pat. No. 4,525,921, issued on Jul. 2, 1985, to John C. Carson et al. for "High Density Electronic Processing Package Structure and Fabrication" discloses an early version of cube packaging involving the use of specially routed chip-edge contact metallization on each passivated chip face avoiding the need for a metal rerouting layer. Silicon dioxide is added to the backside of each chip to complete the electrical isolation of the chips from each other in the stack. The silicon dioxide-isolated chips are fixed to each other by means of a bonding epoxy.

The need for special chip-edge contact metallization routing on each chip is eliminated in later U.S. Pat. No. 5,104,820, issued Apr. 14, 1992, to Tiong C. Go et al. for "Method of Fabricating Electronic Circuitry Unit Containing Stacked IC Layers Having Lead Rerouting". A metal rerouting layer is provided to accommodate the stacking of standard off-the-shelf chips having conventional face mounted contact metallization. The latter patent contemplates the use of certain ordinary insulation films between the aforesaid two layers of metallization as well as on the backside of each chip. Rather than using exclusively oxide insulation between the chips as in the case of U.S. Pat. No. 4,525,921, SiON also is suggested in U.S. Pat. No. 5,104,820 for covering the upper (device side) surface of each chip to isolate the original chip contact metallization from the added rerouting metallization. Silicon nitride is cited to cover the backside of each chip rather than the silicon dioxide of U.S. Pat. No. 4,525,921. An epoxy adhesive is used to fix adjacent stacked chips to each other.

Figure 1A:
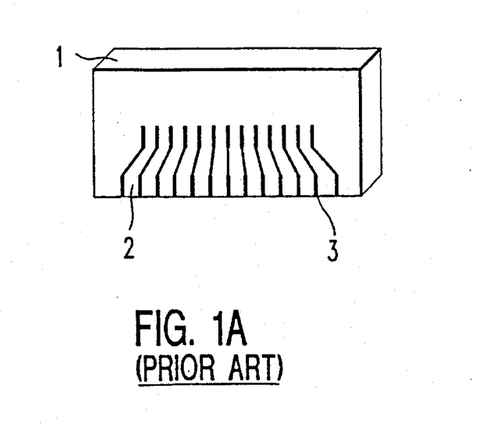
FIGS. 1A–1D are a series of perspective views showing the prior art chip cube fabrication process to which the present invention pertains.

Referring to prior art FIG. 1a, an individual chip 1 is shown having contact metallization 2 which extends to the side surface 3 of the chip. It should be noted that chip 1 also is complete with semiconductor circuit devices and device interconnection metallurgy. Chip 1 may be designed to function as a memory chip, logic chip, or any memory and logic combination chip, for example. The metallization 2 may be designed as part of the original chip surface connections so that module interconnections could be made to pads on the edge 3. Alternatively, and as described in the aforementioned U.S. Pat. No. 5,104,820, the interconnection metallurgy may be designed as second level rerouting metal conductors (insulated from the original silicon and its aluminum or other metallization) which contact the original metallization and extend to pads on the chip edge 3. As previously noted, the latter case permits the use of "off-the-shelf" chips which were designed without regard to their later inclusion in cube packaging.

Figures 1B, 1C:
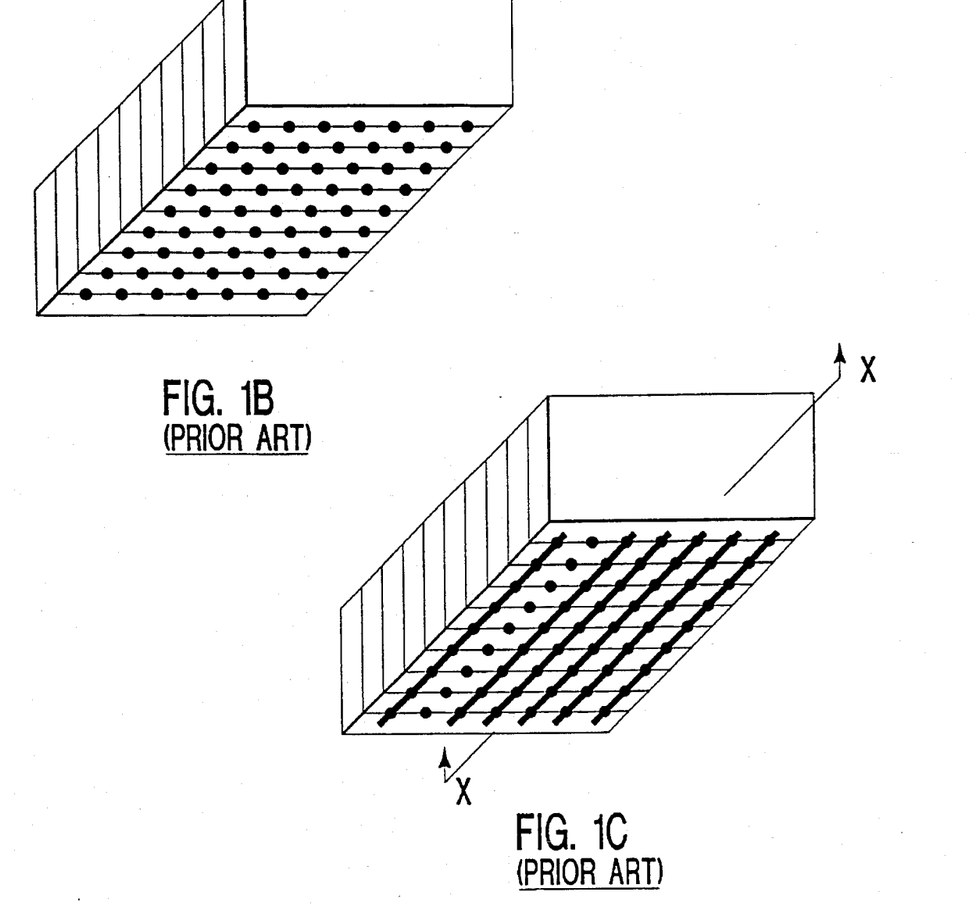
Figure 1D:
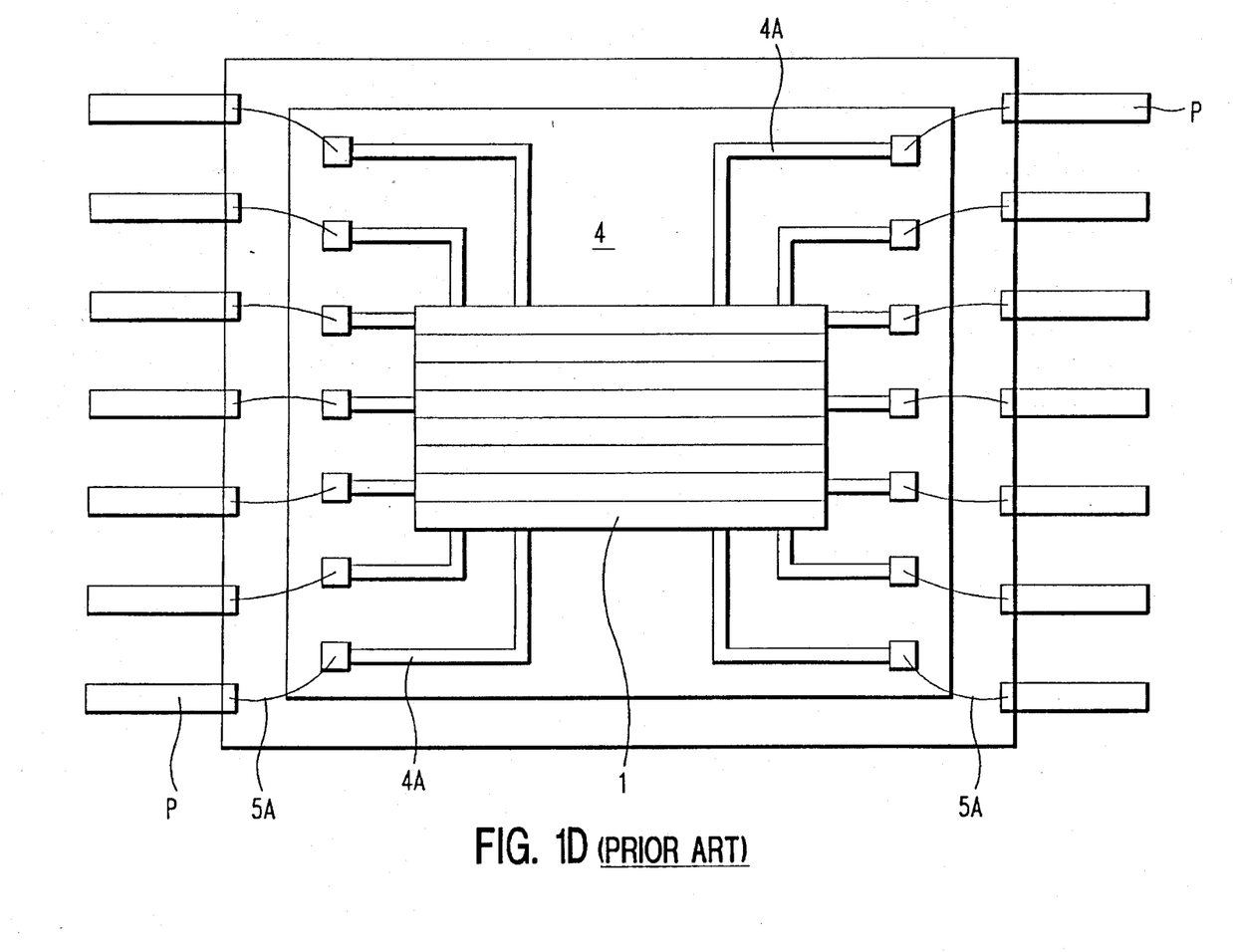

The individual chips 1 are provided with insulating layers under the rerouting metal as well as over the backsides of the chips and are then fixed together with an epoxy adhesive in the cube or stacked configuration of FIG. 1B. Those edge-mounted contact pads which can be connected together (such as power inputs) are ganged by means of busses as shown in FIG. 1C. FIG. 1D is a simplified top view of the resulting structure, showing the cube 1 disposed on an interposer 4, having metal lines 4A that are coupled to the cube bus wiring through conventional solder bump interconnection technology (not shown). The metal lines 4A extend to the periphery of interposer 4, where they are coupled to the interconnecting pins P of package 5 via wirebonds 5A. Note that in the prior art, silicon interposer 4 is necessary to match the thermal expansion coefficient of the silicon chips (that is, because it is made of silicon the interposer will have the same TCE as the chips in the cube). However, the present inventors have noted that while the use of a silicon interposer accounts for the TCE of the chips themselves, it does not address differential chip-to-chip TCE caused by the epoxy used to bond the chips to one another. The best solution would be to eliminate the silicon interposer completely.

Moreover, the foregoing references fail to optimize the electrical properties of the resulting cube. Specifically, the epoxy used to bond the chips to one another is conventionally a high dielectric constant material that is applied as the chips are bonded together. As such, the epoxy material does not optimize the characteristics of the resulting cube package with respect to the operating speed of the contained semiconductor devices, the reliability of the package and the compatibility of the package with respect to existing semiconductor device processing and packaging techniques.

SUMMARY OF THE INVENTION

One object of the invention is to provide a cube package of stacked semiconductor device chips characterized by high operating speed of the contained devices.

Another object of the invention is to provide a cube package of stacked semiconductor device chips having improved reliability.

A further object of the invention is to provide a cube package of stacked semiconductor device chips compatible with existing semiconductor and packaging processing techniques, without the use of a silicon interposer.

These and other objects of the invention are achieved by selecting one of a special group of polyimide insulating materials including BPDA-PDA having 1) a low dielectric constant, 2) a low thermal expansion coefficient, 3) a low elastic moduli, 4) a relatively low cure temperature and 5) an ability to withstand relatively high subsequent processing temperatures. Thermid* (trademark of National Starch and Chemical Co.) or, optionally, one of the selected polyimide materials is substituted for the epoxy of prior packages to bond the adjacent chips to each other. These polyimide layers encapsulate the transfer metallurgy to optimize cube electrical performance.

Another aspect of the present invention is that by using polyimide as the adhesion layer, the adhesion material can be applied at the wafer level prior to chip dicing, enhancing processing efficiency.

Yet another aspect of the invention is that the insulating layers are all applied on the active surface of the wafer, there is no longer a need to apply a dielectric on the back side of the wafer, facilitating wafer thinning operations to reduce the thickness of the chip. This will allow the production of smaller cubes with the same number of chips or more chips in the same size cube.

Existing semiconductor and packaging processing techniques are accommodated by the use of the specially selected polyimide material as insulating and adhesive agents to permit the use of conventional chip-to-substrate solder bump interconnect technology which can reach temperatures of the order of 370° C. or higher. Such temperatures would cause the breakdown of the epoxy glues previously employed in the cube packaging technology.

BEST MODE FOR CARRYING OUT THE INVENTION

It has been found that the prior art cube technology, as described above, suffers from serious shortcomings when applied to advanced semiconductor device chips. In particular, yield may be reduced to unacceptable levels because of cube cracking and poor electrical operating characteristics. These problems are overcome by the present invention by the provision of polyimide insulating and adhesive materials selected from a special group thereof characterized by the following: optimizing thermal coefficient of expansion in both the x, y, and z axes; optimizing mechanical properties, in particular the elastic moduli; sufficient adhesion to eliminate the need for the prior art epoxy; low dielectric constant to minimize conductor capacitance and cross-talk and to maximize cube operating speed; capability to be applied and cured under conditions which do not deteriorate the preexisting structure of the chip; and capability to withstand subsequent preferred processing conditions. The thermal coefficient of expansion optimization must include consideration of chip material (e.g., silicon), substrate material (e.g., silicon, alumina, or glass-ceramic), and solder bump fatigue resistance properties.

Cube fabrication begins at the chip wafer-level with the deposition of polymer and metal structures which transfer the chip input/output connections to one or more edges of the chip, provide insulation, and the adhesive for inter-chip bonding. Following this, the wafer is processed through dicing and cleaning operations, resulting in individual chips that are then stacked and laminated into a cube structure. The cube fabrication process is completed following the deposition of polymer and metal structures on one or more of faces of the cube.

Figure 2:
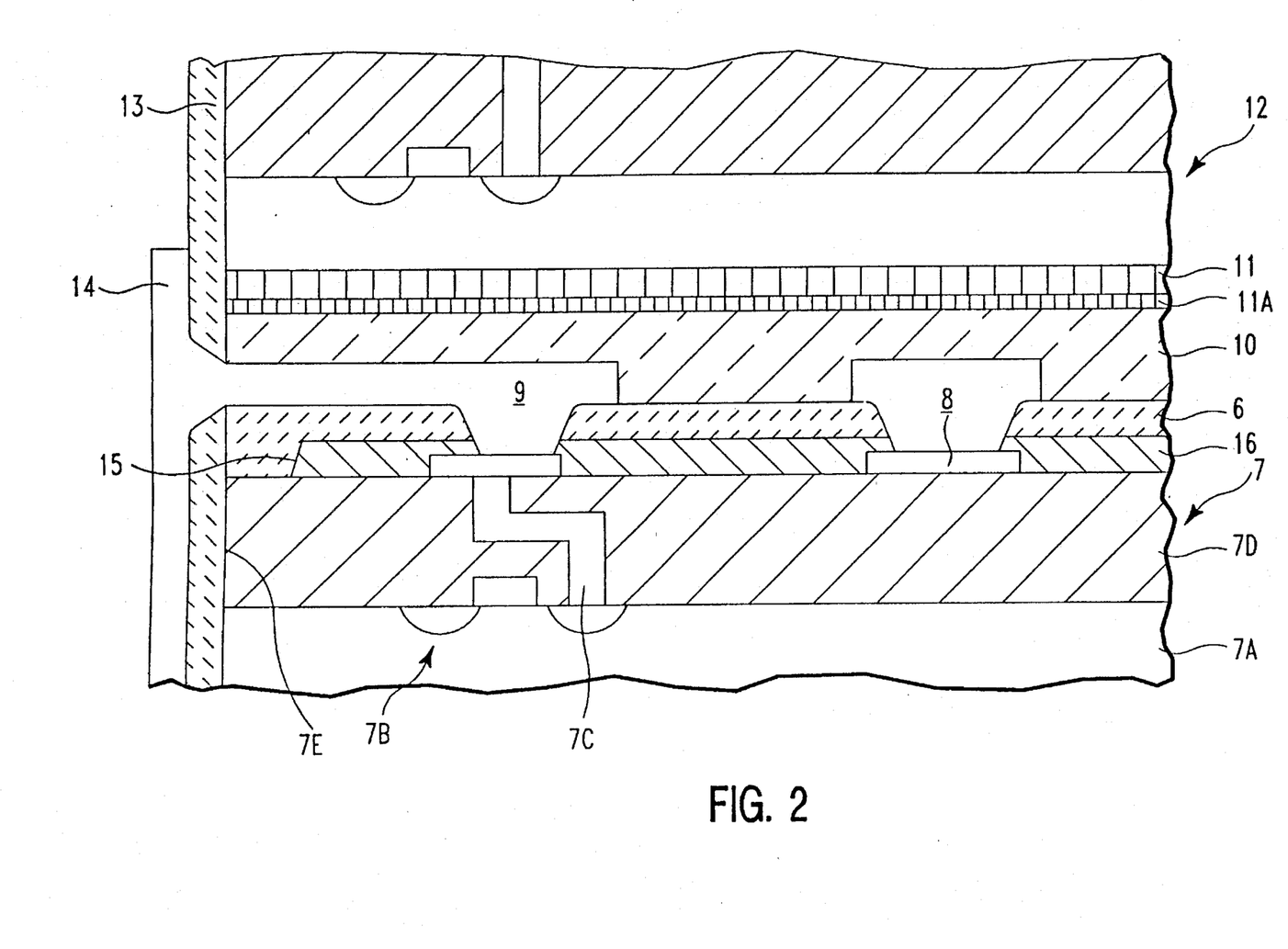
FIG. 2 is an enlarged fragmented cross-sectional view along plane X—X in FIG. 1C of a representative portion of cube-packaged chips insulated and bonded with materials employed in accordance with the present invention.

Referring now to the cross-sectional view, FIG. 2, taken along the plane X—X of FIG. 1c, a first polyimide layer 6 is deposited using well known adhesion promotion techniques at the wafer-level upon the passivated surface 16 of chip 7 comprises, as per conventional practice, a substrate 7A on which is formed a transistor 7B having metallurgy 7C extending through passivation 7D to the pads 8. Obviously a single transistor is shown for ease of illustration, in practice substrate 7A has a full complement of active and passive elements that form the integrated circuitry. The polyimide 6 is then preferentially etched using conventional techniques, to expose pad 8 for contacting rerouting metal layer 9 deposited on the first layer polyimide layer 6 and pad 8. An additional polyimide layer 10 is deposited on metal layer 9 and polyimide layer 6. The composition and deposition processes of layers 6 and 10 will be described in more detail below.

Figures 3, 4, 5:
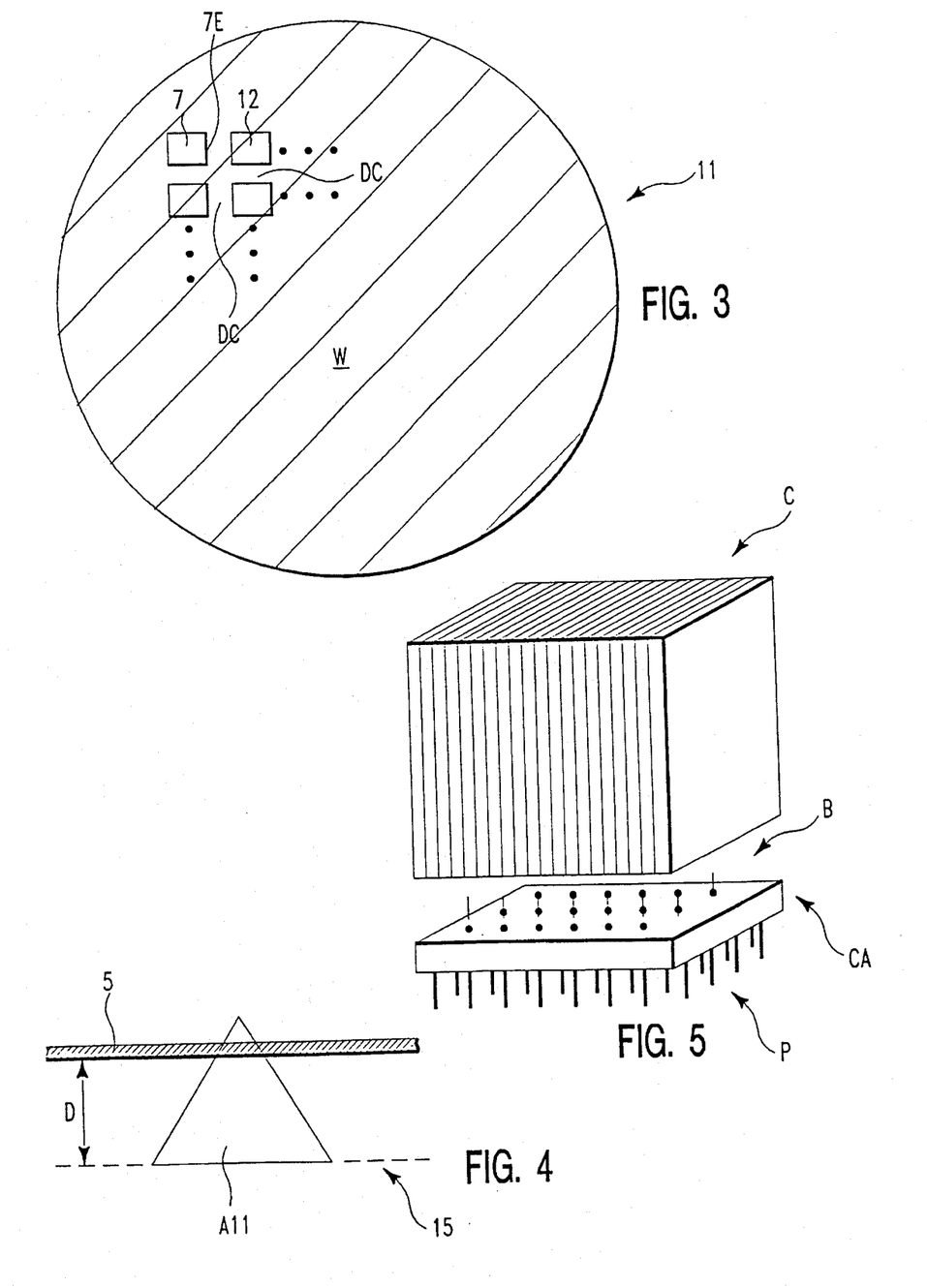
FIG. 3 is a top view of a wafer processed according to the present invention up through deposition of polyimide layer 11.
FIG. 4 is a top view of an alignment marker A11 disposed within the wafer kerf area DC of FIG. 3.
FIG. 5 is an exploded view of a cube C fabricated in accordance with the present invention mounted on a carrier by solder bumps.

The last step in the wafer-level processing is the application of a relatively thin layer 11 of high temperature adhesive e.g. Thermid* (on the order of a few microns) on top of an aminoproplysilane coupling agent 11A over polyimide layer 10. Layers 6, 10, 11 and 11a are formed under processing conditions which do not impair the preexisting structures of chip 7. Moreover, layers 6, 10, 11, and 11A must withstand the thermal, chemical and physical environments when the cube is attached to carrier CA of FIG. 5. The Thermid* is used as the adhesive to bond multiple chips into a cube structure. The replacement of the prior art epoxy with Thermid* results in enhanced thermal and chemical resistance (required for subsequent processing) and lower thermal expansivity. As shown in FIG. 3, at this point in the process the wafer W, having a plurality of chip images 7, 12 thereon, is shown as being coated with layer 11. At this point in the process the chip 7 is referred to as a "chip image" because strictly speaking prior to wafer dicing we do not have separate chips. Note that wafer W has dicing channels DC between adjacent chip images. This is where the dicing saw will be routed to dice the wafer into chips. Conventional dicing techniques are used to dice the wafer resulting in individual chips that are stacked and laminated into a cube structure.

Insulating layer 16 of FIG. 2 is the final chip passivation. Note that this layer is etched to form an edge surface 15 outside the dicing channel with sufficient clearance to avoid damage. This insulation is critical to cube reliability to form an edge seal, which protects the chip from contamination. Note also that polyimide layer 6 in the vicinity of edge 15 extends to side face 7E, resulting in the creation of the edge seal and provides additional edge seal protection during the lead cleaning etch operation. During dicing, polyimide 6 will be cut rather than passivation 16, greatly decreasing contamination of chip 7 due to penetration of contaminants through cracks or other damage to passivation 16 resulting from chip dicing. As shown in FIG. 4, an alignment mark A11 is disposed within the dicing channels DC shown in FIG. 3. During dicing, the wafer is cut along channel 5, such that an area D of the dicing channel DC remains. The alignment mark A11 is aligned to the end surface 15 of the final chip passivation 16. Chips are then laminated together and the side(s) are grounded/polished during cube fabrication removing additional material. Thus, area D is the same as the spacing between end surface 15 and the side face 7E of the chips. The alignment mark A11 thus indicates how close the diced end face comes to the edge seal formed by the combination of polyimide 6 and end surface 15.

The mechanical nature of the dicing process also creates Thermid* surface contamination and damage which results in poor inter-chip adhesion. This problem is solved by either applying a temporary protect overcoat (that is removed prior to chip stacking and lamination), e.g. photoresist, on top of the Thermid* during dicing or doing a planar etchback, e.g., oxygen plasma etching, of the Thermid* surface just prior to chip stacking. The temporary protect overcoat would be on the order of a few microns and removed using solvents. The planar etchback process would remove a few microns of Thermid*. The latter process is particularly compatible with only partially curing the Thermid* at the wafer-level.

A feature of the invention is that by the use of polymer adhesives such as Thermid*, the adhesive can be applied prior to chip dicing, which greatly facilitates subsequent cube processing. Instead of applying an adhesive to individual chips, which presents tooling and adhesive thickness uniformity challenges and throughput limitations and added processing costs, in the invention the adhesive is applied to the wafer prior to dicing, and is dried (without full curing). Thus, the polymer will be solid enough to dice, without carrying out a full cure (which would substantially detract from its adhesive characteristics).

Final curing is achieved during the stacking and lamination processing, to fully bond the chips to one another.

A cube structure is achieved by stacking and laminating the individual chips processed as described above. The stacking and lamination process involves the alignment of chips one on top of another and the application of pressure and temperature to (1) achieve a cube stack of the desired size and periodicity and (2) to bond each of the chips together using the Thermid* (FIG. 2 chips 7 and 12).

The resulting cube is completed by deposition of polyimide layer 13, e.g., BPDA-PDA, on the face(s) of the cube from which the end portion of the transfer metal 9 is exposed and the addition of pad or buss stripe 14 connecting to rerouting metal layer 9. As shown in FIG. 5, the process is completed by attaching the cube C to a carrier CA by the use of solder bumps B, which couple the respective ends of the buss stripes (a layer of metal on the cube C coupled to portions of metal layer 14 shown in FIG. 2) to respective mounting pins P. A feature of the invention is that all of the polymer layers utilized can withstand the solder bump processing temperatures (which for lead/tin solders, can be on the order of 370° C.).

The combination of the dielectric layers with low thermal expansivity and low elastic moduli together with the very thin adhesive layer of relatively low expansivity and high temperature tolerance is directed at minimizing the difference in expansivity in the cube directions parallel and perpendicular to the silicon direction. This directly favorably affects the cube reliability which is achieved when the cube is thermally cycled in a normal operating environment. The combination minimizes cube cracking and separation of chips. It also increases the reliability of the lead tin solder bump connections when attached to a next level of assembly.

The processing and attributes of the invention will now be described in more detail. As mentioned above, the polyimide layers 6, 10, and 11 must have low dielectric properties. For example, with reference to FIG. 2, note that in the final cube assembly the metallurgy 9 over a portion of the first polyimide layer 6 is disposed between the chips 7 and 12 in the cube. For cube applications it is important that capacitive coupling between the metal level 9 and, e.g., the metallurgy of chip 7 below the passivated surface 16 is minimized.

Another issue to consider is the thermal expansion and elastic moduli, e.g., Young's Modulus, of the insulating and adhesive materials. Optimization of these, and related properties, depends upon the specific cube application. For example, reliable solder bump interconnection to the carrier, during which the cube experiences one or more high temperature excursions, requires a low effective thermal expansion for the cube perpendicular to the chip face and low elastic moduli [required for effective stress buffering between the high CTE metallurgy (metal layers 9 and 14 of FIG. 2) and the low CTE chips and reliable interconnection between metal layers 9 and 14]. Note in FIG. 2 that both the CTE and elastic moduli are important in both the horizontal and vertical directions. In practice, the CTE and elastic moduli of many polymer materials differ in the horizontal (or in-plane) and vertical (out-of-plane) directions. This is a function of the inherent topology and orientation of the polymer molecules and the polymer-to-polymer intermolecular interactions. Therefore, for this specific application, selection of polyimides having relatively low out-of-plane CTE and low in-plane and out-of-plane elastic moduli result in the most reliable cube structure. For other applications, e.g., wirebond interconnection between the cube and substrate, relative importance of the various insulating and adhesive physical properties changes, resulting in a different optimization point.

In view of the above discussion, the general properties that a passivation material should possess are set forth in Table 1 below:

TABLE 1

| Property | |
| --- | --- |
| Coefficient of Thermal Expansion (CTE) | |
| A) x–y direction | <50 ppm/C. @ 25° C. |
| B) z direction | <200 ppm/C. @ 25° C. |
| Young's Modulus | |
| A) x–y direction | <160 GPa |
| B) z direction | <10 GPa |
| Glass Transition Temperature | |
| A) High temperature subsequent process | >350° C. |
| B) Low temperature subsequent process | ≧150° C. |
| Dielectric Constant | <4 |

For solder connection applications (i.e. wherein low tin, lead/tin or other solders are used to connect the assembled cube to the carrier), in addition to the considerations presented above, it is essential to utilize a polyimide material that has a glass transition temperature which results in a cube structure that can withstand the approximately 370° C. process temperatures utilized during solder bump processing. The inventors have found that for these applications the polyimide BPDA-PDA is superior, in that it has a high glass transition temperature, low CTE and elastic moduli, and low dielectric constant (3.6).

BPDA-PDA and related polyimides suitable for use with the present invention are disclosed in copending U.S. patent application Ser. No. 07/740,760, for Low TCE Polyimides As Improved Insulator in Multilayer Interconnect Structures, filed Aug. 5, 1991, in the names of J. P. Hummel et al. and assigned to the present assignee. The BPDA-PDA polyamic acid compositions used in the invention are derived from the condensation reaction of 3, 3', 4, 4'-biphenic-dianhydride and p-phenylene diamine. These compositions are prepared by an offset stoichiometry reaction using 100 mole parts of an aromatic dianhydride. After the reaction goes to completion, the resultant polyamic acid composition has residual amine groups present from the access diamine used in the reaction. These reactive amine groups are stabilized or deactivated by the addition of an aromatic anhydride which reacts with these groups to form terminal amic acid functionality. The resulting BPDA-PDA polymer properties as a function of solids content and stoichiometry offset are as follows:

TABLE 2

BPDA-PDA Polymer Properties as a function of solids content and stoichiometry offset A — Polyamic Acid Properties

| Stoichiometry | 1:0.985 | 1:0.991 |
|---|---|---|
| Molecular Weight | 25,000 to 36,000 | 34,000 to 49,000 |
| % solids | 10.5–11.5 | 14.5–15.5 |
| Intrinsic Viscosity | 1.0–1.6 dL/g | 1.1–1.7 dL/g |
| Viscosity | 2200–3000 cSt | 30,000 cSt to 35,000 |
| Film Thickness @ 2000 rpm spin for 30 sec. & cure to 400° | 2.5–3.5 μm | 10.5–12.5 μm |
| B-Polyimide Properties | | |
| Young's modulus (calculated @ 1% strain) | 9–12 GPa | 9–13 GPa |
| Film Thickness used | 8.5 μm (3 coats) | 8.5–10.5 μm (1 coat) |
| Ultimate Tensile Strength (UTS) | 500–580 MPa | 500–580 MPA |
| Elongation-at-Break (Eb %) | 35–55% | 35–55% |

*Cross-head speed (strain rate) = 0.5–2 mm/min
Glass Transition temperature >400° C.
Thermal expansion measured by TMA method -
Average TCE = 5–6 ppm °C. at 100° C. computed in 75–125° C. range.

Dielectric constant as measured by the capacitor technique using Al—Cu/Polyimide insulator/Al—Cu dots:

Er=2.9 at 1 MHz to 10 MHz; and 3.0 at 10 KHz to 100 KHz, dissipation factor=0.002 under the same conditions, PMDA-ODA derived polyimide has dielectric constant of 3.4–3.5.

For lower temperature applications, e.g., wirebond interconnection of the cube to a carrier, other polyimides, such as DuPont 5878 or PMDA-ODA, could work. These applications require a less stringent optimization of the insulating material mechanical and thermal properties in order to deliver an acceptable level of reliability and quality. Therefore, in certain applications these materials may be used based upon other considerations, e.g., cost.

Because the polyimide layers 6 and 10 have optimized properties, a relatively thin layer (up to approximately 6 microns) of Thermid* can be used as the adhesive material. After spin application, the Thermid* is baked (e.g. by baking to 85° C. for 45 minutes) without full imidization, again so as to make it sufficiently stable (e.g. to withstand chip dicing and stacking). After chips 7 and 12 are joined together, the whole stack is laminated and the Thermid* cured (e.g., by baking through a series of temperature plateaus ultimately achieving a peak temperature of 350°–400° C. for a time in excess of 30 minutes). This will fully adhere the chips to one another by full imidization of the Thermid* adhesive.

Thus, the present invention offers significant advantages by providing a void-free film of fully cured polyimide between chips of a stack. Voids are created when attempting to cure polyimide confined between chips of a stack. Associated with these voids are serious mechanical and reliability problems. Applicants found and disclose in this application advantageous materials and methods to prevent void formation. Applicants noted that voids are created by the volatile reaction products of polyimide imidization, and a reaction product of particular concern is water. At atmospheric pressure, water vaporizes at 100° C., and water left in the film would vaporize, expand, rupture the film, and tear apart the stack of chips when the temperature is elevated for solder interconnection, providing serious manufacturing and reliability problems. First, as described above, a specific polyimide, Thermid, was found that has the advantage of not producing water during imidization. Second, as described below, process steps are disclosed having the advantage of permitting selected polyimides that produce water to still be used so that sufficient water is removed from the film at chip edges during the curing process.

Applicants have thereby avoided a problem that appears in other attempts to bond chips with polyimide. For example, in Japanese patent 4-132258, layers of polyimide are deposited on two chips, and the layers are fully cured. Then the chips are brought together and heated under pressure to soften the polyimide and squeeze the cured layers of polyimide together to form a mechanical interlock between the cured layers at the interface. The chemical bonding and mechanical interlock of the present application provides a vast improvement over that technique, with significantly greater mechanical and hydrolytic stability: in a humid environment, water that penetrates the structure of the present invention has no such weak interface to mechanically uncouple. The present invention has the advantage that the film is fully cured only after the chips are stacked. Thus, the film has the usual sequence of covalent chemical bonds tightly connecting all its parts. There is no weak interface within the film lacking those bonds.

The invention facilitates chip thinning, to form a smaller cube. That is, in previous designs that relied on epoxy adhesives there was a need to form an oxide or nitride coating on the backside of chips to be mounted into the cube. Because polymer adhesive materials do not provide such contamination issues, these backside coatings are no longer required. Thus it is possible to thin the chips and directly bond them to one another with the polymers applied to the frontsides of the wafer prior to dicing. Thus, as shown in FIG. 2 the Thermid layer directly contacts and adheres to the silicon substrate of chip 12, which in practice is substantially thinned (down to approximately 100 microns) by backside grinding to substantially reduce the size of the cubes.

An alternate embodiment of the present invention is to construct a cube having the same cross section as that shown in FIG. 2, without the use of the polymer adhesive layer 11. That is, the upper polymer layer 10 could be generally processed in the same manner as the adhesive layer (by partial curing at the wafer level and then full cure during stacking and joining). Because the BPDA-PDA polymer of the invention tends to form water condensation products special processing must be exercised during the final cure to facilitate the removal of the condensation products from the polyimide film. This processing includes increased cure times, reduced temperature ramp rates, and curing in a vacuum environment.

As shown in the tables of properties listed above, the polyimide layers can be selected and processed to provide a coefficient of thermal expansion that is either the same as the silicon in the cubes, or is the same as other materials such as ceramics or glass epoxies. As a result, as shown in FIG. 5, the cube of the present invention can be packaged without the use of a silicon interposer 4 as needed in the prior art. That is, with the polyimide layers selected to have TCEs similar to ceramics, the carrier CA can be a ceramic that directly supports the output pins P, without the use of a silicon interposer. So the invention has utility in both applications. In situations in which a silicon interposer is desired, the invention improves reliability by more closely matching the TCEs of the cube and the interposer. In situations in which a ceramic or other material is used as the cube mount (such material having a TCE that is different from silicon) the invention uses different polyimides that more closely match the TCEs of such materials.

While the invention has been described above with reference to a particular embodiment, it is to be understood that various modifications may be made to such embodiment without departing from the spirit and scope of the invention.

What is claimed is:

1. A method for forming a semiconductor structure, comprising the steps of:

forming a plurality of integrated circuit chips on an upper surface of a wafer, said wafer having a first coefficient of thermal expansion;

forming a sandwich structure of a first insulation layer, a first layer of transfer metallurgy, and a second insulation layer on said wafer, said first and second layers of insulation having coefficients of thermal expansion that approximate that of said wafer and having dielectric constants no greater than approximately 4;

applying a polymer adhesion material on top of said sandwich structure;

drying said polymer adhesion material without full curing;

dicing said wafer to separate said plurality of integrated circuit chips from one another; and stacking said plurality of integrated circuit chips together and bonding said stacked chips together by heating to a temperature sufficient to cause said polymer adhesion material to cure.

2. The method as recited in claim 1, wherein said first and second layers of insulation have a glass transition temperature of above approximately 150° C.

3. The method as recited in claim 1, wherein said first and second layers of insulation have a glass transition temperature of above approximately 350° C.

4. The method as recited in claim 1, wherein said first and second layers of insulation have a Young's Modulus of less than approximately 160 GPa measured along a first given plane of said first and second layers of insulation as formed.

5. The method as recited in claim 4, wherein said first and second layers of insulation have a Young's Modulus of less than approximately 10 GPa measured along a second given plane of said first and second layers of insulation as formed, said second given plane being orthogonal to said first given plane.

6. The method as recited in claim 1, wherein said first and second layers of insulation have the same coefficient of thermal expansion.

7. The method as recited in claim 6, wherein said coefficient of thermal expansion is less than approximately 50 ppm/°C. measured along a first given plane of said first and second layers of insulation as formed.

8. The method as recited in claim 7, wherein said coefficient of thermal expansion is less than approximately 200 ppm/°C. measured along a second given plane of said first and second layers of insulation as formed, said second given plane being orthogonal to said first given plane.

9. The method as recited in claim 1, wherein both of said first and second layers of insulation have dielectric constants of approximately 3.6.

10. The method as recited in claim 9, wherein said dielectric constants are substantially similar in all planes.

11. The method as recited in claim 10, wherein said first and second layers of insulation are comprised of BPDA-PDA.

12. The method as recited in claim 1, further comprising the steps of depositing a layer of polyimide on an exposed surface of the plurality of integrated circuit chips as bonded together; and depositing a layer of interconnect metallurgy that contacts said first layer of transfer metallurgy through said layer of polyimide.

13. The method as recited in claim 12, wherein said layer of polyimide is comprised of BPDA-PDA.

14. The method as recited in claim 1, wherein said step of forming said sandwich structure further comprises the steps of:

depositing a first layer of polyimide on said wafer, and drying said first layer of polyimide without producing full imidization;

depositing said layer of transfer metallurgy that extends through said first layer of polyimide to contact conductive portions of said integrated circuits on said plurality of integrated circuit chips; and depositing a second layer of polyimide on said wafer, and fully curing both of said first and second layers of polyimide.

15. A method of forming a multi-chip integrated circuit structure, comprising the steps of:

forming a plurality of integrated circuit chips on a wafer, said wafer having a first coefficient of thermal expansion, each of said plurality of integrated circuit chips having a first passivation layer thereon;

forming an interconnection structure on said first passivation layer, comprising a first layer of metal disposed within a first polymer material, said first polymer material having a coefficient of thermal expansion that approximates that of said wafer and a dielectric constant that is less than approximately 4;

forming an adhesive polymer layer on said interconnection structure, said adhesive polyimide layer being heated to stabilize without fully curing;

dicing said plurality of integrated circuit chips from said wafer;

bonding at least one of said plurality of integrated circuit chips to another one of said plurality of integrated circuit chips by bringing a surface of one of said plurality of integrated circuit chips into contact with a surface of another one of said plurality of integrated circuit chips having said layer of adhesive polymer layer thereon, and fully curing said adhesive polymer layer to form a unitized multi-chip body having a plurality of surfaces;

depositing a second passivation layer on one of said plurality of surfaces of said unitized body; and forming a second layer of metal that extends through said second passivation layer to contact said first layer of metal.

16. The method of claim 15, wherein during said step of forming said plurality of integrated circuit chips on said wafer, said first passivation layer is etched to form an edge surface, such that during said dicing step said first passivation layer is not cut.

17. The method of claim 16, wherein said first polymer material is disposed over said edge surface of said first passivation layer, such that during said dicing step said first polymer material is cut.

18. A method of bonding a first integrated circuit chip to a workpiece, of said first integrated circuit chip being diced from a wafer having a plurality of integrated circuit chip images on a first surface thereon including said first integrated circuit chip image, comprising the steps of depositing a polymer layer on a first surface of said wafer;

drying said polymer layer;

dicing said wafer;

bringing said polymer layer on said first integrated circuit chip into contact with said workpiece; and fully curing said polymer layer.

19. The method of claim 18, further comprising the step of:

prior to said step of depositing said polymer adhesive layer, thinning said wafer by removing a portion of a second surface of said wafer opposite said first surface.

20. The method of claim 18, further comprising the steps of:

prior to said step of dicing said wafer, depositing a protective layer on said polymer layer; and after said step of dicing said wafer, removing said protective layer.

21. The method of claim 20, wherein said protective layer comprises photoresist.

22. The method of claim 18, further comprising the step of, after said step of dicing said wafer, removing a surface portion of said polymer layer.

23. The method of claim 18, further comprising the steps of:

after said step of fully curing said polymer layer, bonding the first integrated circuit chip and said workpiece to a carrier, said carrier being comprised of a first material, said polymer material having a coefficient of thermal expansion that is similar to that of said first material.

24. The method of claim 23, wherein said first material is comprised of ceramic or glass.

25. A method for forming a semiconductor structure comprising the steps of:

a) forming a plurality of integrated circuit chips on a wafer, each of said plurality of integrated circuit chips having a first passivation layer thereon;

b) forming a sandwich structure on said first passivation layer, said structure comprising a first polymeric insulation layer, a first rerouting metal layer and a second polymeric insulation layer;

c) dicing said plurality of integrated circuit chips from said wafer;

d) bonding at least one of said plurality of integrated circuit chips to another chip to form a unitized multi-chip body having a plurality of surfaces;

e) depositing a second passivation layer on one of said plurality of surfaces of said unitized body; and f) forming a second layer of metal that extends through said second passivation layer to contact said first rerouting metal layer.

26. A method as recited in claim 25, wherein said second layer of metal extends over said second passivation layer.

27. A method as recited in claim 25, wherein said wafer, said first, and said second polymeric insulation layers have coefficients of thermal expansion that are approximately equal.

28. A method as recited in claim 25, wherein said first polymeric insulation layer has a dielectric constant that is less than approximately 4.

29. A method as recited in claim 25, further comprising between said steps (b) and (c) the step of forming an adhesive layer on said second polymeric insulation layer.

30. A method as recited in claim 29, wherein said adhesive is polymeric.

31. A method as recited in claim 30, wherein said first and second polymeric layers and said adhesive are polyimides.

32. A method as recited in claim 31, wherein said polyimides include one of BPDA-PDA, Dupont 5878, PMDA-ODA and Thermid.

33. A method as recited in claim 30, further comprising the step of heating to stabilize said polymeric adhesive. without substantial curing and wherein said bonding step (d) is accomplished by bringing a surface of one of said plurality of integrated circuit chips into contact with a surface of another chip, said adhesive polymer layer therebetween, and fully curing said adhesive polymer layer.

34. A method as recited in claim 25, further comprising between said steps (b) and (c) the step of heating to stabilize said second polymeric insulation layer without curing, and wherein said bonding step (d) is accomplished by bringing a surface of one of said plurality of integrated circuit chips into contact with a surface of another chip, said second polymeric insulation layer therebetween, and fully cuing said second polymeric insulation layer.

35. The method as recited in claim 25, wherein during said step of forming said plurality of integrated circuit chips on said wafer, said first passivation layer is etched to form an edge surface, such that during said dicing step said first passivation layer is not cut.

36. The method as recited in of claim 35, wherein said first polymer material is disposed over said edge surface of said first passivation layer, such that during said dicing step said first polymer material is cut.

\* \* \* \* \*